(12) United States Patent  
Yang et al.

(10) Patent No.: US 6,940,926 B1  
(45) Date of Patent: Sep. 6, 2005

(54) DIGITAL PHASE/FREQUENCY DETECTOR

(75) Inventors: Ganning Yang, Irvine, CA (US); John Walley, Ladera Ranch, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 816 days.

(21) Appl. No.: 09/799,822

(22) Filed: Mar. 5, 2001

(51) Int. Cl.$^7$ ............................. H04L 27/06; H03D 1/00
(52) U.S. Cl. ..................... 375/340; 375/377; 327/603; 327/26
(58) Field of Search ............................ 375/316, 340, 375/324, 371, 375, 377; 327/26, 31, 35

(56) References Cited

U.S. PATENT DOCUMENTS

| | | | | |
|---|---|---|---|---|
| 3,611,157 A | * | 10/1971 | Hughes | 327/31 |
| 3,906,379 A | * | 9/1975 | Tuhro | 327/37 |
| 3,911,219 A | * | 10/1975 | Mullins | 375/330 |
| 3,991,378 A | * | 11/1976 | Schaefer | 331/14 |
| 4,126,831 A | * | 11/1978 | Cochran | 331/8 |
| 4,531,102 A | * | 7/1985 | Whitlock et al. | 331/1 A |
| 4,571,514 A | * | 2/1986 | Nelson et al. | 327/33 |
| 4,642,643 A | * | 2/1987 | Wise et al. | 342/13 |
| 5,652,531 A | * | 7/1997 | Co et al. | 327/12 |
| 5,781,423 A | * | 7/1998 | Inarida et al. | 363/41 |
| 5,805,460 A | * | 9/1998 | Greene et al. | 702/79 |
| 6,549,571 B1 | * | 4/2003 | Baba | 375/224 |

* cited by examiner

Primary Examiner—Jean B Corrielus

(57) ABSTRACT

A digital phase/frequency detector capable of being implemented with on-chip components and configured to detect signals having small modulation indices. Transition points within the signal are detected and the width between successive transition points measured and averaged. The average width measurements may be converted to width deviation values by subtracting out the width due to the carrier frequency. An interpolation may be performed between the current and previous values of the width deviation values to reduce quantization error. The interpolated values may be converted to frequency deviation values, and a predetermined number of the frequency deviation values may be averaged. The average frequency deviation values may then be equalized in order to reduce intersymbol interference. The resulting equalized values form soft estimates of the underlying source bits. Hard estimates of the source bits may then be derived from the soft estimates.

36 Claims, 11 Drawing Sheets

DIGITAL PHASE/FREQUENCY DETECTOR

BACKGROUND OF THE INVENTION

1. Field of the Invention

This invention relates generally to phase/frequency detectors, and, more specifically, to phase/frequency detectors suitable for applications involving signal with small modulation indices.

2. Related Art

Many wireless applications, such as Bluetooth, Home RF and WLAN, require low complexity phase/frequency detectors which are capable of detecting GMSK/GFSK signals have small modulation indices, i.e., modulation indices less than about 0.4. Detectors based on analog limiters and discriminators have been widely in some wireless applications, but they typically imply large die sizes and off-chip components. Correlator type digital detectors have been used in some wireless applications, but these detectors are typically not sensitive enough to detect signals having small modulation indices. Sigma delta frequency converters have been used in wireline FM applications, but entail high complexity and lack of compatibility with wireless applications.

SUMMARY

The invention provides a digital phase/frequency detector capable of being implemented with on-chip components, and having the capability of detecting GMSK/GFSK signals having low modulation indices. A signal is input to a transition point detector. The transition point detector outputs a signal indicating transition points in the input signal. A transition point in the input signal is a transition through a predetermined level, such as a zero crossing.

A width measurement circuit measures the width between successive transition points, and outputs a signal representing these width measurements. An averaging circuit averages a predetermined number of width measurements from the width measurement circuit.

A conversion circuit converts the resulting average width measurements to width deviation values by, in effect, subtracting out the width of the carrier frequency.

An interpolating circuit performs an interpolating function on the resulting width deviation values provided by the conversion circuit in order to reduce any quantization error introduced by the transition point detector and/or width measurement circuits.

A frequency conversion circuit converts the interpolated width deviation values from the interpolating circuit to frequency deviation values. An optional averaging circuit averages a predetermined number of the frequency deviation values from the frequency conversion circuit to accommodate a desired symbol rate.

An equalizing circuit equalizes a signal derived from the output of the optional averaging circuit in order to mitigate intersymbol interference introduced by the averaging circuit, the interpolating circuit, and the optional averaging circuit. The output of the equalizing circuit comprises soft estimates of the source bits. These soft estimates may be input to a decision circuit which compares the soft estimates with a predetermined threshold, and, based thereon, produces hard estimates of the source bits.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The invention can be better understood with reference to the following figures. The components in the figures are not necessarily to scale, emphasis instead being placed upon illustrating the principles of the invention. Moreover, in the figures, like reference numerals designate corresponding parts throughout the different views.

DETAILED DESCRIPTION

Figure 1:
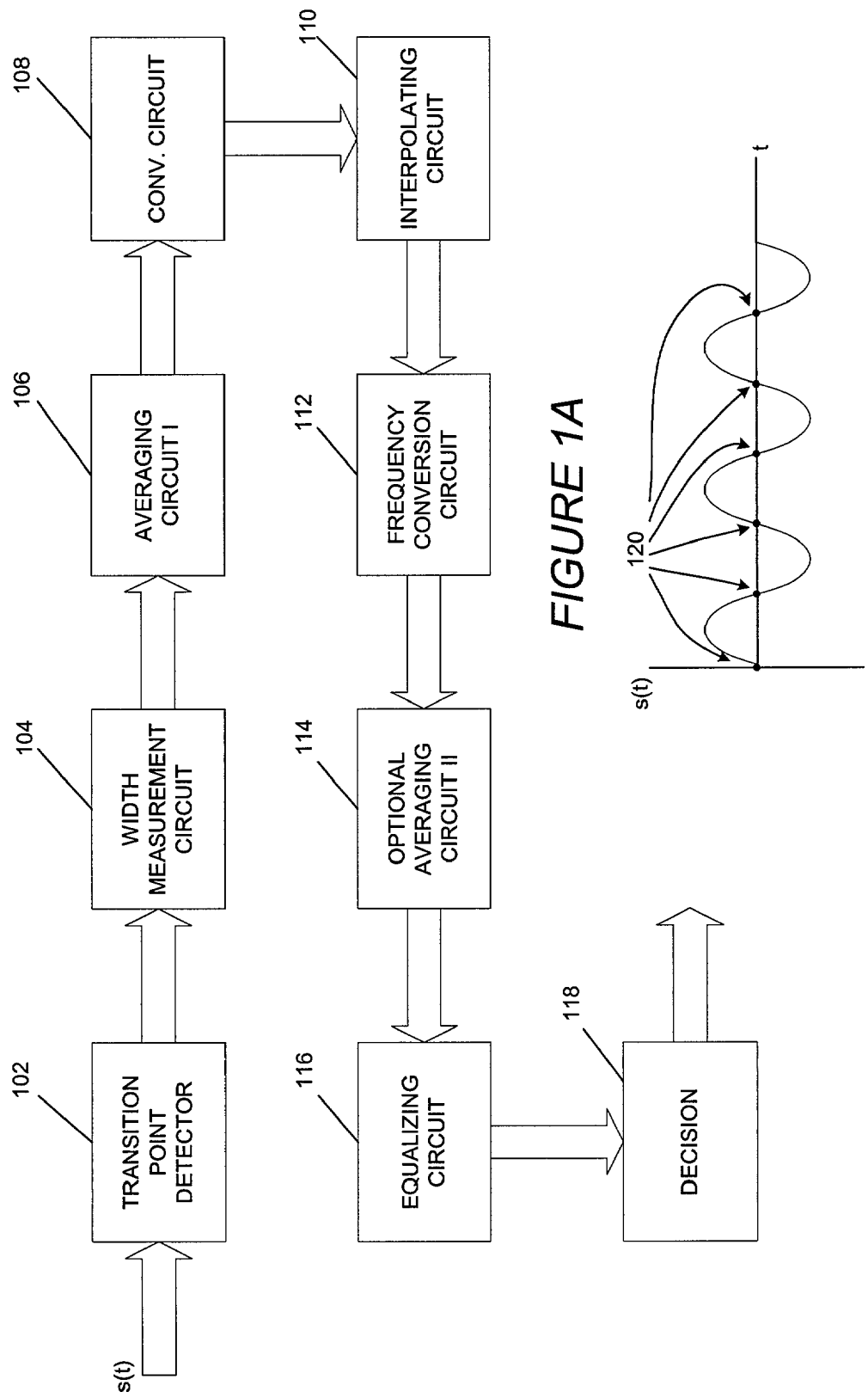
FIG. 1A is a block diagram of a phase/frequency detector according to the invention.
FIG. 1B is a diagram illustrating zero crossings in an example waveform.

An embodiment of a digital phase/frequency detector according to the invention is illustrated in FIG. 1A. An input signal s(t) is input to a transition point detector 102. In one implementation, the signal s(t) is an intermediate frequency (IF) signal having been previously been demodulated down to IF frequencies from RF frequencies. The transition point detector 102 detects transitions of the signal s(t) through a predetermined level. In one implementation, transition point detector 102 detects zero crossings, such as identified by numeral 120 in FIG. 1B.

The transition point detector 102 is followed by a width measurement circuit 104, which measures the width between successive transition points. The resulting width measurements are provided to averaging circuit 106.

Averaging circuit 106 averages a predetermined number of the width measurements. The resulting average width measurements are provided to conversion circuit 108. Conversion circuit 108 converts the average width measurements from the averaging circuit 106 to width deviation values by subtracting out a parameter relating to the width associated with the carrier frequency.

The resulting width deviation values are then input to interpolating circuit 110. Interpolating circuit 110 performs an interpolating function on the width deviation values to reduce any quantization error introduced by the transition point detector 102 and/or width measurement circuit 104.

The output of the interpolating circuit 110 is input to frequency conversion circuit 112. Frequency conversion circuit 112 converts the interpolated width deviation values from interpolating circuit 110 into frequency deviation values, i.e., deviations of the frequency from the carrier frequency. Optional averaging circuit 114 successively averages a predetermined number of the frequency deviation values.

The output of the optional averaging circuit 114 is input to equalizing circuit 116. Equalizing circuit 116 receives the resulting average frequency deviation values and equalizes the same to reduce inter-symbol interference (ISI) introduced by the transmitter and/or receiver filtering, such as any ISI introduced by averaging circuit I (numeral 106), the interpolating circuit (numeral 110), and optional averaging circuit II (numeral 114).

The output of equalizing circuit 116 comprises soft estimates of the underlying source bits. These soft estimates are input to decision block 118. Decision 118 compares the soft estimates with a predetermined threshold, and, based thereon, outputs hard estimate of the underlying source bits.

It is difficult to detect signals with small modulation indices, and several blocks in the foregoing embodiment work together to provide the necessary performance. First, averaging circuit 106 averages several width measurements to reduce quantization error and remove dependence of the IF carrier frequency. In one implementation, circuit 106 is implemented as a filter, and the longer the length of the filter, the greater the accuracy. However, circuit 106 may introduce intersymbol interference if the averaging length is too long. This side effect can be mitigated by equalizing circuit 116.

Second, interpolating circuit 110 based on a PLL or FLL type concept interpolates between width deviations rather than frequency deviations, and circuit 112 converts the resulting interpolated width deviation values to frequency deviation values. This architecture (FLL followed by frequency deviation conversion rather than FLL operating on and interpolating frequency deviation values) further improves the accuracy.

Third, the frequency conversion circuit 112 may employ a non-linear process to further improve the accuracy.

Finally, the equalizing circuit 116 improves the accuracy by eliminating side effects introduced by blocks 106, 110, 114, and other filters.

Note that in the embodiment of FIG. 1, conversion circuit 108 could be placed between interpolating circuit 110 and frequency conversion circuit 112 at the expense of a slight increase in the complexity of circuit 110 due to the increased wordlength. Since this increase in complexity is not present in the configuration of FIG. 1, it is preferred.

Also, the output of optional circuit 114 is normally average frequency deviation values, but, depending on the number of values over which the averaging is performed, the output of circuit 114 may be differential phase values.

Furthermore, in configurations in which optional circuit 114 is present, this circuit may be combined with equalizing circuit 116 to form a single block since both are filters.

Figure 2:
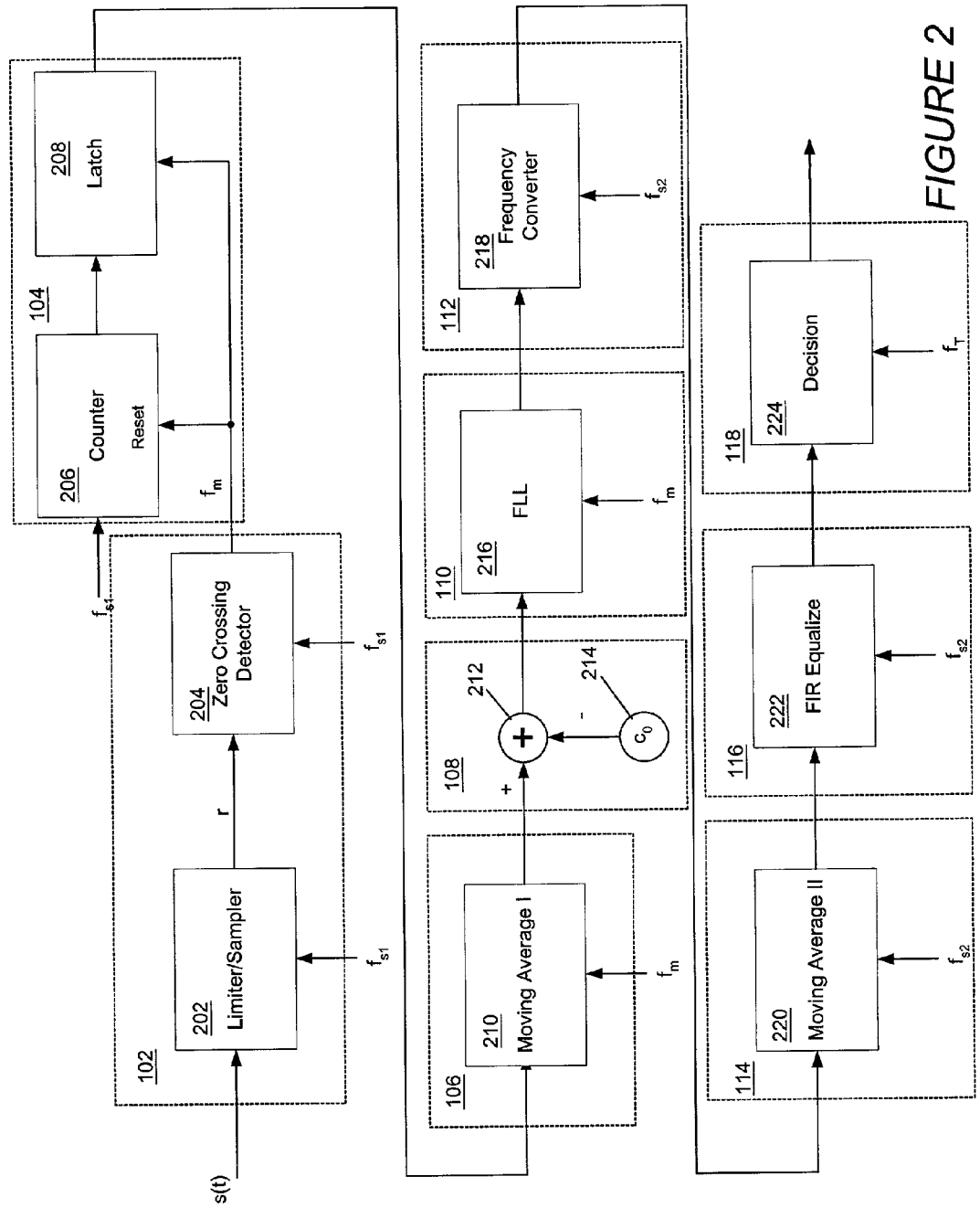
FIG. 2 is a block diagram of an implementation example of the detector of FIG. 1.

An implementation of the embodiment of FIG. 1A is illustrated in FIG. 2. In this implementation, the input signal s(t) is assumed to be an intermediate frequency (IF) signal modulated according to Gaussian Frequency Shift Keying (GFSK) or Gaussian Minimum Shift Keying (GMSK). In this implementation, limiter/sampler block 202 oversamples the modulated IF signal using a high speed clock having a frequency $f_{s1}$. Generally, the frequency $f_{s1}$ exceeds the highest frequency of the input signal s(t). It may even exceed the Nyquist frequency of the input signal (twice the highest frequency). In one example, where the carrier frequency of the IF signal is about 10 MHz, the frequency $f_{s1}$ may be on the order of 64 MHz. Block 202 also limits the modulated IF signal into one of two values. In one example, all positive samples are converted to "1"s and all negative samples are converted to "0"s.

Figure 3:
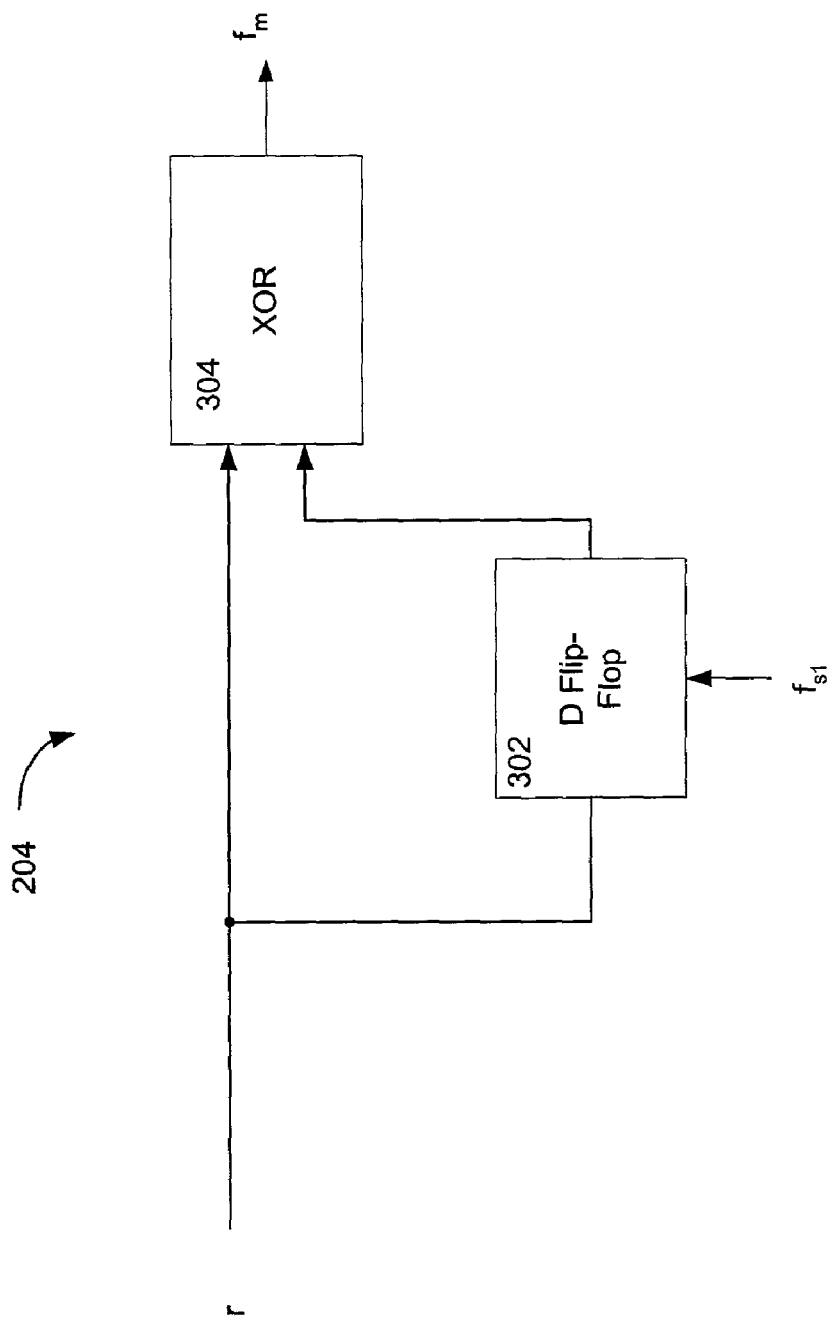
FIG. 3 is a block diagram of an implementation of a transition point detector.

The digitized samples are then input to zero crossing detector 204. Zero crossing detector 204 continuously examines whether two consecutive bits have different values, and if so, indicates this condition through an appropriate setting on an output signal indicated in the figure as having a frequency $f_m$. In one example, the zero crossing detector 204 is implemented as shown in FIG. 3 as a D flip-flop 302 clocked at the frequency $f_{s1}$ and an XOR gate 304. The XOR gate 304 compares a sample r with the previous sample as delayed one clock period through D flip-flop 302. If the values of the two samples are different, XOR gate 304 will output a logical "1"; if the values of the two samples are the same, XOR gate 304 will output of logical "0". The result is an output signal which is normally zero, but which is punctuated with pulses indicating transition points at the input signal. The frequency with which the pulses occur is denoted $f_m$.

A high speed counter 206 within width measurement circuit 104 continuously outputs quantized measurements of the width between successive zero crossings of the input signal. The counter is clocked at the sampling frequency $f_{s1}$, and counts incrementally when the output of the zero crossing detector 204 is low. When a pulse appears at the output of the zero crossing detector 204, an event which occurs at the frequency $f_m$, the contents of the counter are latched by latch 208, and the counter 206 reset. The result is that a quantized width measurement is latched in latch 208 at every zero crossing, whether negative or positive going.

It should be appreciated that the latched width measurements may not be reliable indicators of the deviations from the IF carrier frequency which are inherent in the input signal. The reasons are that (1) the sampling frequency $f_{s1}$ is not synchronized with the actual zero crossing frequency due to the modulation present in the input signal (although it will typically be synchronized with $f_m$, which is a quantized representation of the zero-crossing frequency); and (2) the quantization error may be severe.

Figure 4:
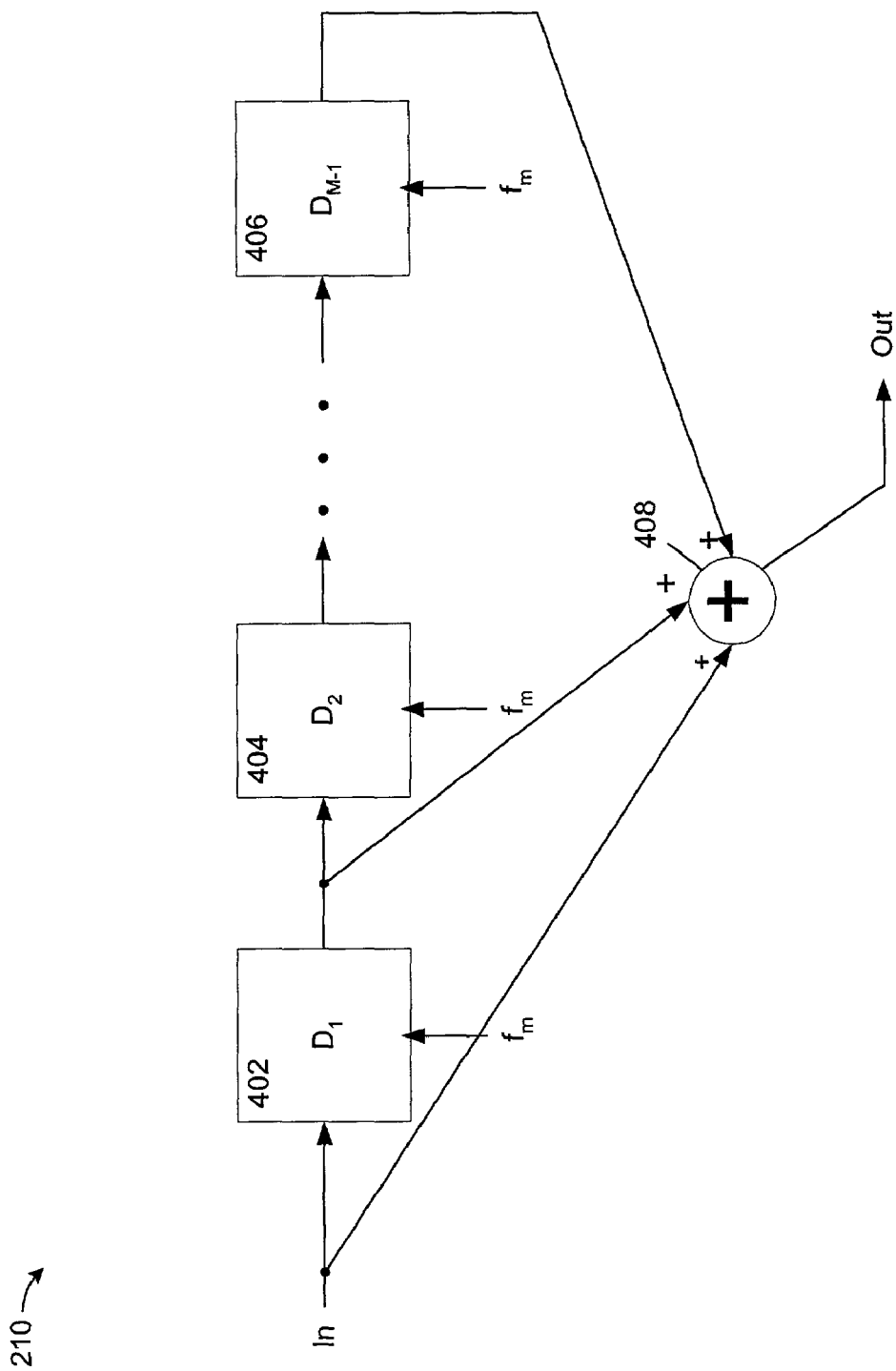
FIG. 4 is a block diagram of an implementation of a circuit for determining the moving average of a predetermined number M of width measurements.

The moving averaging block 210 continuously averages a fixed number of the width measurements from latch 208. In one implementation example, which is illustrated in FIG. 4, the moving average block 210 is a boxcar filter which includes (M−1) shift registers or D flip-flops 402, 404, 406 and adder 408. The filter is configured to sum the contents of the latch (the most recent width measurement) with the (M−1) previous width measurements as stored in the flip-flops 402, 404, 406. The parameter M is an integer greater than 1, and is programmable depending on the IF carrier frequency, and the data symbol rate of the input signal.

In one implementation, block 210 serves two purposes. First, it is used to reduce measurement quantization error by accumulating multiple consecutive pulse width measurements. Second, it may be used to accommodate different RF architectures with different IF carrier frequencies. For example, in one application involving a low ratio of IF carrier frequency $f_c$ to the data symbol rate $f_T$, such as about 1–2, M can be set to 2. In another IF application, where the ratio of the IF carrier frequency $f_c$ to the symbol rate $f_T$ is on the order of 10, M may be set to 10, for example. By varying M depending on the application, block 210 can provide comparable frequency deviation measurements with different RF architectures.

Note that the implementation of block 210 which has been described provides information about average frequency in a prescribed time period rather than instantaneous frequency information, even through instantaneous information is ultimately needed. As will be seen, this artifact will be overcome by the other blocks.

Block 108 converts the average width measurements into local width deviation values. In the implementation illustrated in FIG. 2, block 108 comprises adder/subtractor 212 which reduces an output from the moving average block 210 by the constant $c_0$, which is determined from the formula:

$$c_0 = \frac{M \times f_{s1}}{2 \times f_c} \quad (1)$$

where M is the programmable number of width measurements which are averaged by block 210, $f_{s1}$ is the sampling frequency, and $f_c$ is the IF carrier frequency of the input signal.

The output of block 108 is input to frequency lock loop (FLL) 216. In one embodiment, FLL 216 interpolates between successive ones of the width deviation values from block 108, and therefore only tracks frequency deviation indirectly. This is significant because, if width deviation values were first converted to frequency deviation values, in order to permit tracking of frequency deviation by the FLL, quantization error could potentially be greatly increased, as the conversion from width deviation to frequency deviation would involve a non-linear process. Thus, improved performance has been observed using the configuration described, in which interpolation is directly performed on the incremental width measurements. That is true even when large frequency offsets are present.

Figure 5:
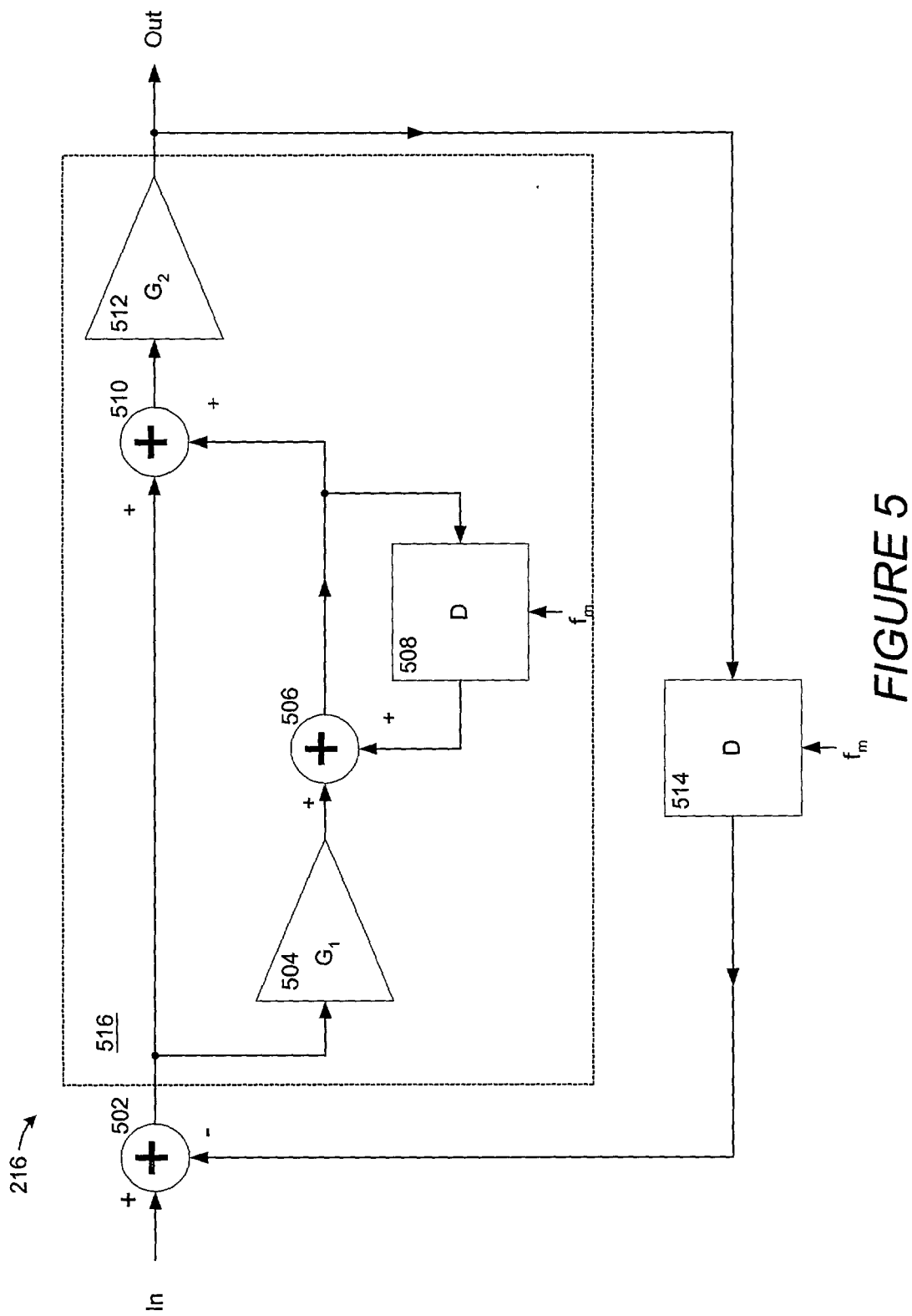
FIG. 5 is a block diagram of an implementation of a frequency locked loop.

Referring to FIG. 5, an implementation example of FLL 216 comprises a second-order loop filter 516 clocked at the rate $f_m$, flip-flop 514 also clocked at the rate $f_m$, and adder/subtractor 502. One skilled in the art will recognize, however, that other filter embodiments, such as a first-order filter, may be used as well.

The loop filter 516 comprises filter taps 504 and 512, having respective programmable tap coefficients $G_1$ and $G_2$, adders 506 and 510, and flip-flop 508. The tap coefficients G1 and G2 may be selected based on such requirements as desired loop filter bandwidth and damping factor keeping in mind the tradeoff between loop bandwidth and noise suppression and interference. For example, a narrow filter bandwidth may lead to noise suppression benefits, but may also introduce the Inter-Symbol Interference (ISI), which may degrade demodulation performance. However, as will be seen, such side effects may be overcome, at least in part, by the remaining blocks. In one embodiment, for example, applicable to schemes such as Bluetooth, a GFSK modulated signal with a BT of 0.5 and a modulation index of 0.32 is used. With a data symbol rate of 1 Mbps and an IF carrier frequency of 2 MHz, good performance can be obtained by setting programmable parameters $G_1$ and $G_2$ to 0.5 and 0.25, respectively.

The output of the FLL implementation in FIG. 5 at time t will be a weighted sum of all previous inputs to the FLL, with the greatest weight being applied to the most recent inputs. For example, the weight assigned to the current input is $G_2(1+G_1)$, and that assigned to the previous input is $G_1G_2-(1+G_1)^2G_2^2$. Assuming $G_1$ and $G_2$ are set to 0.5 and 0.25 respectively, the weight for the current input translates into 0.375, and that for the previous input translates into −0.0269. Thus, it can be seen that the FLL will in effect interpolate between the current and previous width deviation values.

The output of FLL 216 is input to frequency conversion block 218, which converts the interpolated width deviation values into frequency deviation values. In one implementation example, illustrated in FIG. 6, frequency conversion block 218 comprises D flip-flop 602, multiplier 604, a programmable tap 606, and an adder/subtractor 608.

The rate at which width deviation values are provided to the block 218 is at the rate determined by $f_m$, which is the frequency at which FLL 216 is clocked. Although blocks 206, 208, 210, and 216 run at an effective rate $f_m$, these blocks are synchronized with $f_{s1}$. A desired symbol rate $f_T$ for data modulation purposes may be obtained by resampling the output of the FLL at the rate $f_{s2}$. The frequency $f_{s2}$, which will be referred to as the second sampling frequency, may be used to clock the remaining blocks 218, 220, and 222 in the detector. Advantageously, the ratio $f_{s2}/f_T$ is an integer, and in one example, the rate $f_{s2}$ may be selected to be four times the symbol rate $f_T$. For example, assuming $f_{s1}$ is 64 MHz, $f_T$ is 1 MHz, and the carrier frequency is 1 MHz (which implies a value for $f_m$ of 2 MHz, since there will be two zero crossings per cycle, then a reasonable value for $f_{s2}$ is 4 MHz (consistent with a value of $f_{s2}/f_T$ of 4).

Figure 6:
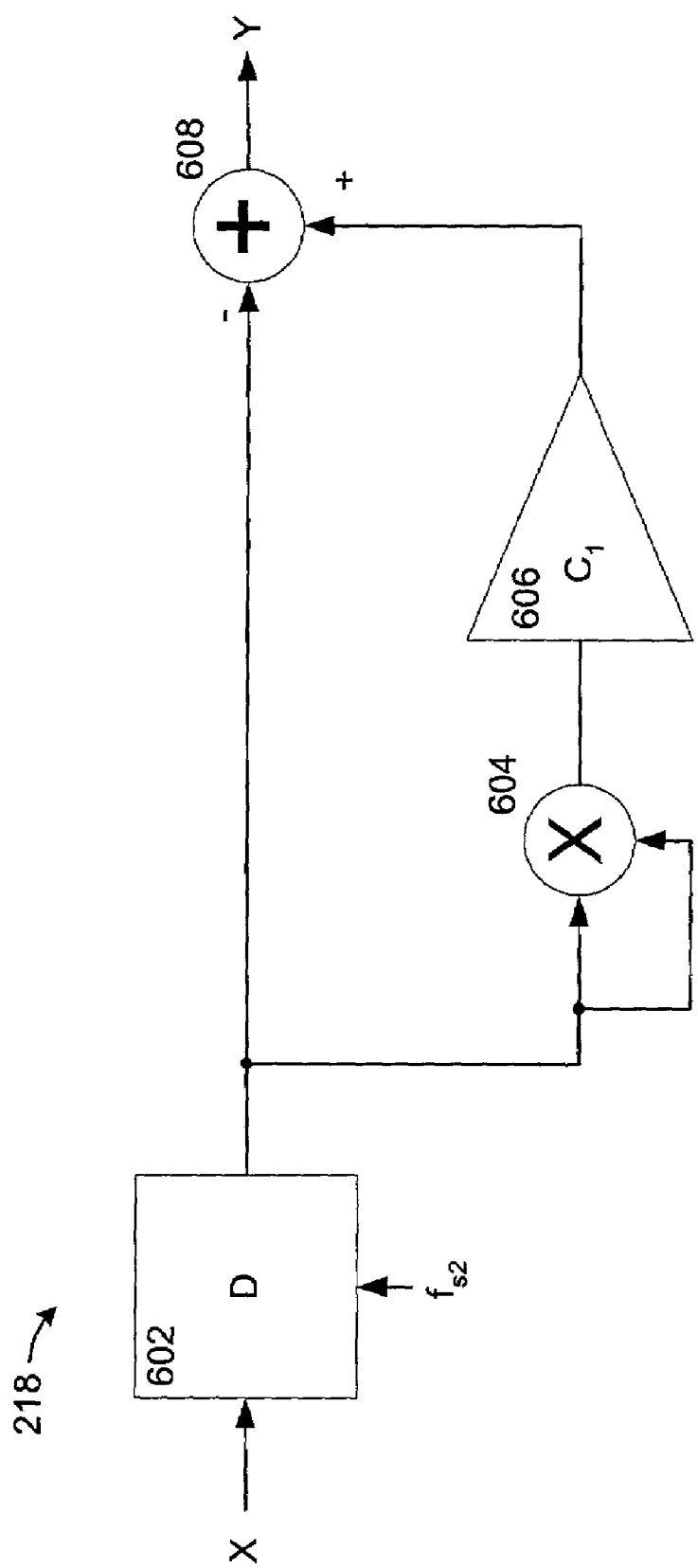
FIG. 6 is a block diagram of an implementation of a frequency translation circuit.

The tap coefficient of tap 606 is a programmable parameter $c_1$ which, in the particular implementation illustrated in FIG. 6, is defined by the following formula:

$$c_1 = \frac{2 \times f_c}{M \times f_{s1}} \quad (2)$$

where $f_c$ is the IF carrier frequency; and M is the number of samples averaged in the first moving average block 210. Note that this is just the inverse of expression (1) above.

The frequency conversion formula defining the relationship between the output Y of block 218 and the input X to that block is as follows:

$$Y = \left(\left(\frac{2 \cdot f_c \cdot X^2}{(M \cdot f_{s1})}\right) - X\right) \cdot \left(\frac{4 \cdot f_c^2}{(M^2 \cdot f_{s1})}\right) \quad (3)$$

where $f_c$ is the IF carrier frequency; $f_{s1}$ is the sampling frequency; M is the number of samples averaged in the first moving average block 210; X is the input to block 218 (and the output from the FLL 216); and Y is the output in the frequency conversion block 218.

An explanation of the derivation of this formula is as follows. Consider that frequency deviation Y=current frequency−carrier frequency=(1/current width−1/carrier width)=−(current width−carrier width)/(current width*carrier width). However, the value (current width−carrier width) is equal to X, the width deviation value input to block 218. Therefore, the frequency deviation Y can be re-expressed as −X/{(X+carrier width)*carrier width}. If (X/carrier width<<1), the expression for Y can be further simplified to −X*(1−X/carrier width)/(carrier width*carrier width). Since carrier width=M*$f_{s1}$/(2*$f_c$), expression (3) results.

This formula may be simplified depending on the application. For example, if a relative (differential) rather than absolute frequency deviation is of interest, as is the case with GFSK/GMSK systems, the constant scale $$\left(\frac{4 \cdot f_c^2}{(M \cdot f_{sI})}\right)$$

may be omitted. Thus, for these systems, the formula is:

$$Y = \left(\left(\frac{2 \cdot f_c \cdot X^2}{(M \cdot f_{sI})}\right) - X\right) \quad (4)$$

In addition, if the modulation index is very small and no large frequency offsets exist, the term $$\left(\frac{2 \cdot f_c \cdot X^2}{(M \cdot f_{sI})}\right)$$

may be omitted, and the formula further simplifies to:

$$Y = -X \quad (5)$$

The functionality for any particular case may be implemented, if desired, in logic or a ROM table, for example.

Figure 7:
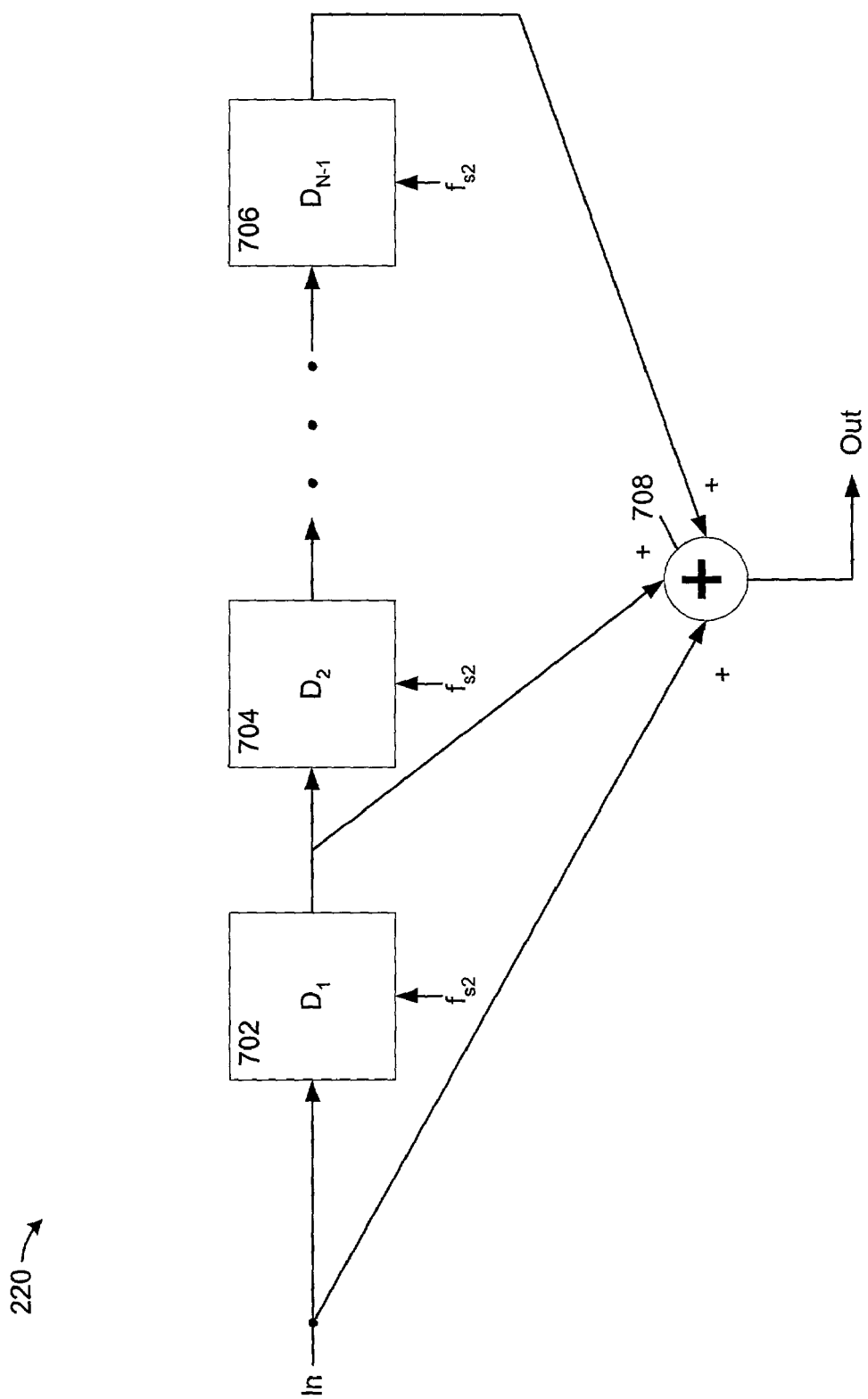
FIG. 7 is a block diagram of an implementation of a circuit for determining the moving average of a predetermined number N of frequency translated average width measurements.

Second moving average block 220 makes appropriate adjustments consistent with the symbol rate $f_T$. In one implementation, illustrated in FIG. 7, the second averaging block 220 comprises (N−1) of D flip-flops 702, 704, 706, where N is an integer greater than or equal to 1. Each of the flip flops are clocked at the second sampling rate $f_{s2}$. The outputs of the flip-flops and the input to block 220 (output of block 218) are added by adder/subtractor 708. The result is an average over N samples.

Generally, the number of samples N which are averaged depends on the second sampling rate $f_{s2}$ and the desired symbol rate $f_T$. For example, if the second sampling frequency $f_{s2}$ is set at a rate which is 4×$f_T$, and a 1 bit differential phase detector is desired (where soft or hard bit estimates are output by the detector at the symbol rate 1/$f_T$), then four consecutive samples will be used for the averaging process. The number of flip-flops required in block 220 is then equal to N−1 or 3. In this example, if a 0.25 bit differential phase detector is desired (where soft or hard bit estimates are output by the detector at 4× the symbol rate 1/$f_T$), then no flip-flops are required and the block 220 should be bypassed. In one example, the second averaging block 220 is configured to provide 1-bit differential phase detection, such as may be used to demodulate GFSK/GMSK signals.

Figure 8:
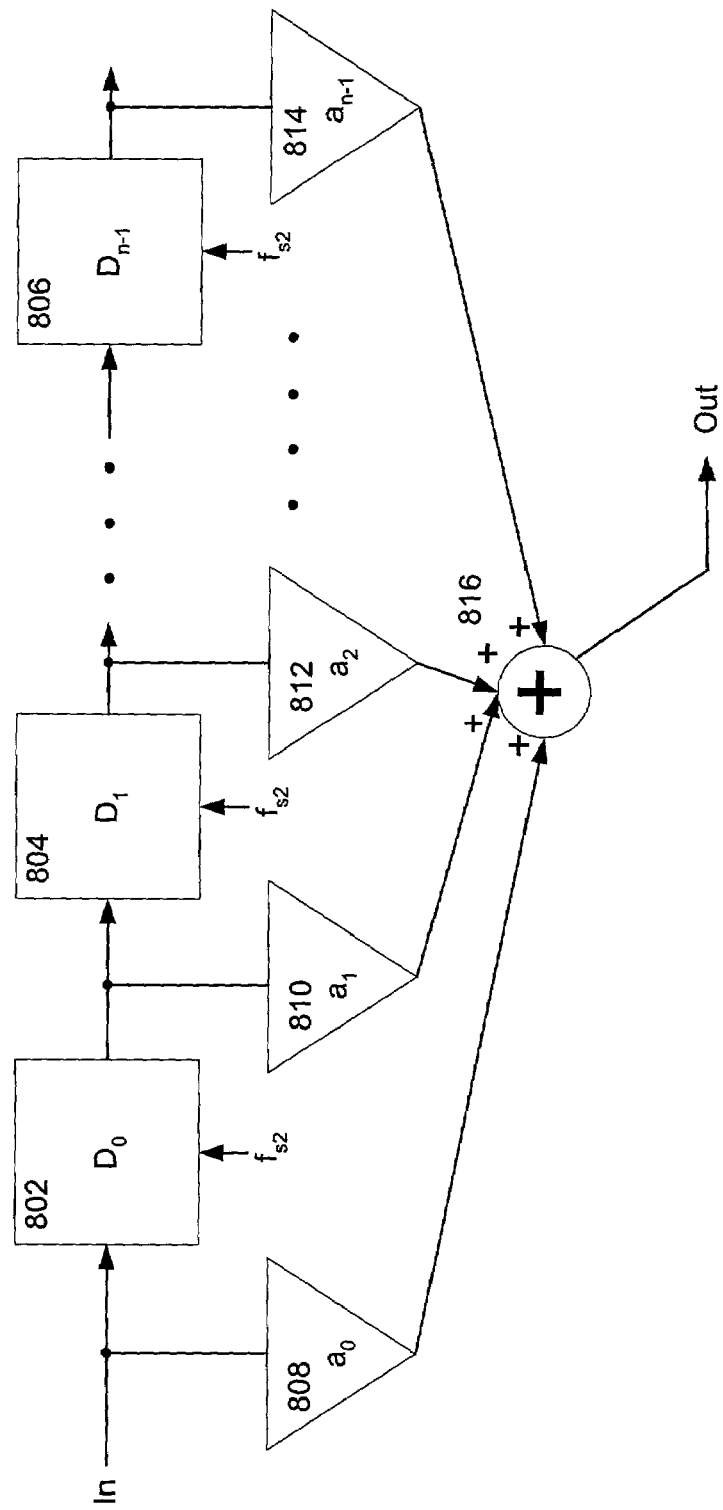
FIG. 8 is a block diagram of an implementation of an equalizer.

The output of block 220 is input to FIR equalizer block 222. In one implementation, illustrated in FIG. 8, FIR equalizer 222 is a low pass filter which reduces intersymbol interference (ISI), such as may be introduced by averaging blocks 210 and 220, and FLL 216. It may also improve demodulation performance, especially in environments where co-channel interference is present. As illustrated, this implementation of block 222 comprises n−1 D flip-flops 802, 804, 806, where n is an integer greater than or equal to 1, n filter taps 808, 810, 812, 814, having programmable filter tap coefficients of, respectively, $a_0$, $a_1$, $a_2$, and $a_{n-1}$, and adder/subtractor 816. The FIR filter tap coefficients $a_0$–$a_{n-1}$ may be selected as desired. As an illustrative example, for use in a Bluetooth application, n may be selected to be 7, and the filter tap coefficients $a_0$–$a_6$ may be selected to be −2, −1, 4, 6, 4, −1, −2, respectively, to maximize "eye" openness for the data demodulation.

Figure 10:
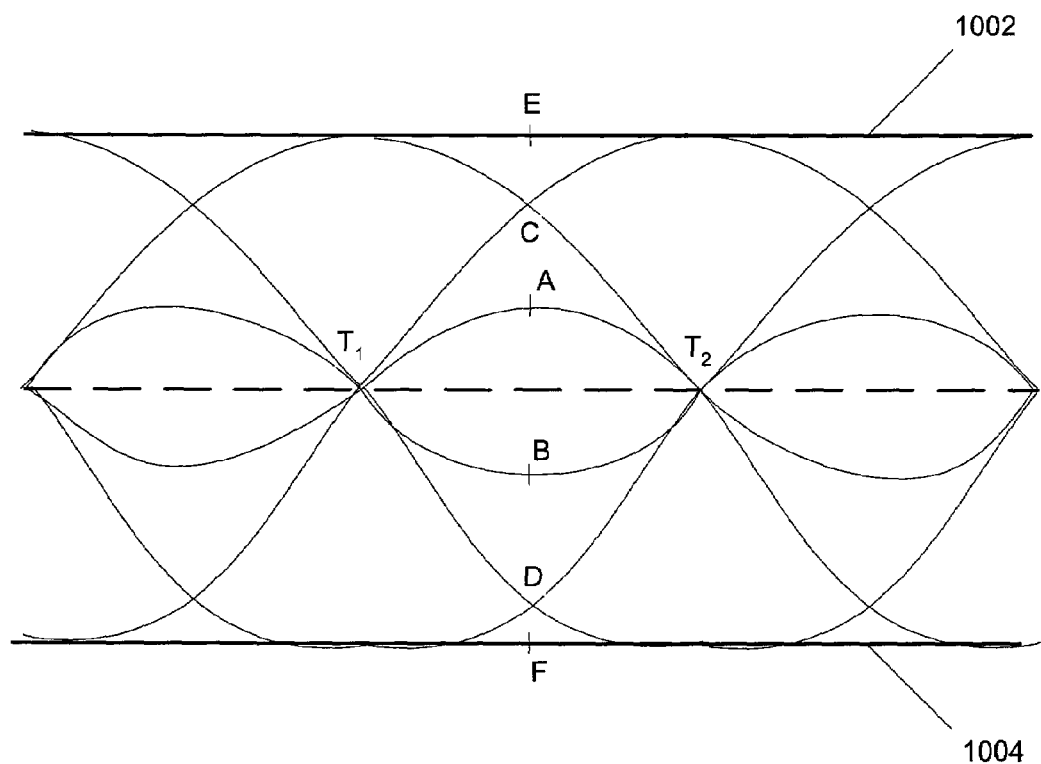
FIG. 10 illustrates an "eye diagram" for the output of the detector of Figure.

The concept of "eye" openness may be further explained by reference to the "eye" diagram of FIG. 10. In this figure, lines 1002 and 1004 are the maximum eye open boundaries. When consecutive "1"s are transmitted, the line 1002 will result. When consecutive "0"s are transmitted, the line 1004 will result. Other curves will result from other data patterns. For example, "010" will result in $T_1AT_2$ in the figure; "101" will result in $T_1BT_2$ in the figure; "110" or "011" will result in a pattern which passes through point C; "100" or "001" will result in a pattern which passes through point D; "111" will result in a pattern which passes through point E; and "000" will result in a pattern which passes through point F.

From the above descriptions, it will be seen that the degree of eye opening depends on the data pattern, and that the "101" or "010" data patterns will cause the least eye opening, and therefore, be the most susceptible to noise or interference, such as ISI.

In an ideal case, points A, C and E become one point, and points B, D and F become one point. In this ideal case, the eye is open the maximum amount, and does not depend on data patterns. In this ideal case, no ISI can exist.

In a non-ideal case, such as occurs in practice, the eye is not open the maximum amount, and the amount of opening depends on the response to the "101" or "010" data patterns. The purpose of FIR equalizing block 222 is to open the eye in response to the "101" and "010" data patterns.

The output of FIR equalizer block 222 consists of soft estimates of the underlying source bits. These soft estimates may be input to decision block 224, which converts the soft estimates from FIR equalizing block 222 into hard bit decisions. In one implementation, this occurs by comparing the soft estimates to a predetermined threshold. If the threshold is exceeded, a "1" is estimated; otherwise, a "0" is estimated. It should be appreciated that other implementations are possible, such as where a "0" is output if the threshold is exceeded, and a "0" is output otherwise, or where hard estimates are derived through a process other than comparison with a threshold. It should also be appreciated that embodiments are possible where the output of the detector is the soft estimates, and decision block 224 is not included as part of the detector.

Figure 9A:
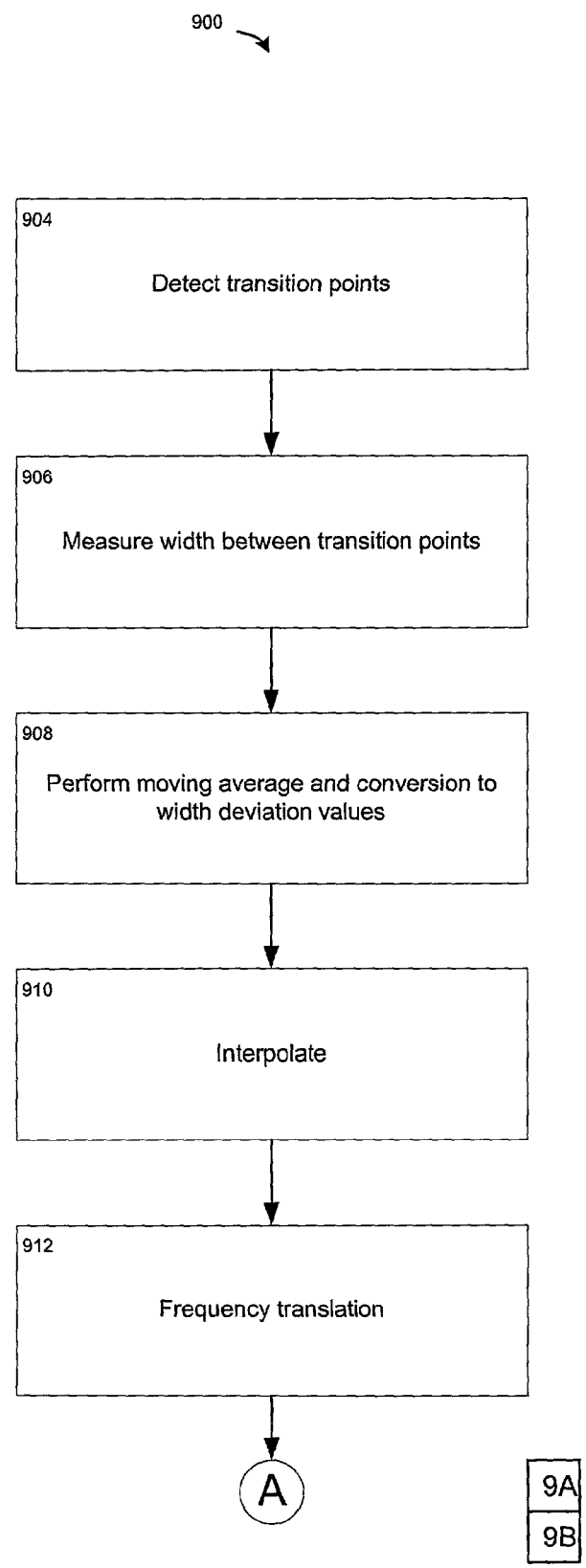
FIGS. 9A–9B is a flowchart of a method of detecting a low modulation index signal according to the invention.
Figure 9B:
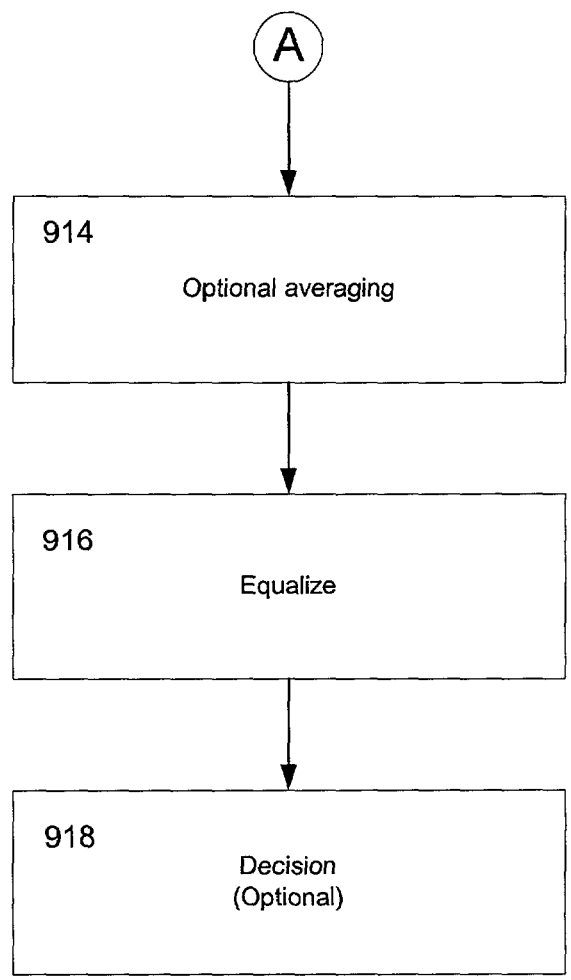

Referring next to FIGS. 9A–9B, an embodiment of a method according to the invention is illustrated. The method begins with step 904, in which the transition points of an input signal s(t) are detected. These transition points may be zero crossings or some other transition points. The signal s(t) may be a modulated signal such as a modulated GFSK/GMSK IF signal or some other modulated signal. In one implementation, the transition points are detected by oversampling the signal, limiting the signal into one of two binary values or bits, and comparing the values of successive bits in order to detect the transition points at the locations where the values of successive bits change.

Step 904 is followed by step 906, in which the width between successive transition points is measured. In one implementation, this step occurs by resetting a counter when a transition point is encountered, allowing the counter to then count forward, and then latching the contents of the counter when the next transition point is encountered. In this implementation, the contents of the latch represent a measurement of the width between successive transition points.

Step 906 is followed by step 908 in which a predetermined number of the width measurements are averaged together. The average width measurement may then be converted into an width deviation value by subtracting out the width due to the carrier frequency. In one implementation, the conversion is performed by subtracting the constant $$c_0 = \frac{M \times f_{s1}}{2 \times f_c}$$

from the average width measurements, where M is the programmable number of width measurements which are averaged in the averaging step, $f_{s1}$ is the sampling frequency, and $f_c$ is the IF carrier frequency of the input signal.

Step 908 is followed by step 910 in which an interpolation is performed between successive width measurements. In one implementation, this step is performed through a FLL operating on the width deviation values from step 908 rather than frequency deviation information. In one implementation example, the FLL employs a loop filter whereby the output of the FLL is an interpolation between the current and previous values of the width deviation values.

Step 910 may be followed by step 912, in which the interpolated width deviation values from step 910 are translated into frequency deviation values. The frequency deviation values indicate the deviations in frequency from the carrier frequency that are being experienced by a particular portion of the input signal s(t).

Step 912 may be followed by optional step 914, in which a predetermined number of frequency values from step 912 are averaged together. In one implementation, this step is performed in order to achieve a desired symbol rate $1/f_T$.

Step 914 is followed by step 916, where the frequency values are equalized in order to open the corresponding "eye" diagram, and thereby mitigate intersymbol interference (ISI). The result is soft estimates of the underlying source bits. In one implementation, the soft estimates comprise differential phase values Δθ, or equivalently, frequency values f.

Step 916 is followed by optional step 918 in which hard estimates of the source bits may be derived from the soft estimates. In one implementation, the hard estimates are derived by comparing the soft estimates with a predetermined threshold. For example, if the soft estimates are in the form of differential phase values AO, this step may be performed by comparing the values with a threshold T, and outputting a logical "1" is T is exceeded and a logical "0" otherwise.

It should be appreciated that embodiments are possible where the foregoing steps, or the blocks of FIGS. 1A and 2, are performed in hardware, including but not limited to ASICs, software, or a combination of hardware and software, such as code running on a general purpose DSP. For purposes of this disclosure, the terms "logic", "circuit", "stage", "block" or the like encompass implementations where the corresponding functions are performed by hardware, software, and a combination of hardware and software. If implemented in software, the foregoing steps may be tangibly embodied as a series of instructions stored on a processor readable medium, including but not limited to RAM, ROM, PROM, EEPROM, EPROM, hard disk, floppy disk, CD-ROM, DVD, flash memory, etc. The medium may be a component of a system comprising a processor configured to access and execute the instructions as tangibly embodied on the processor readable medium.

While various embodiments of the invention have been described, it will be apparent to those of ordinary skill in the art that many more embodiments and implementations are possible that are within the scope of this invention. Accordingly, the invention is not to be restricted except in light of the attached claims and their equivalents.

What is claimed is:

1. A digital detector comprising:
   a transition point detector for detecting transition points in an input signal, successive transition points being separated by a width;
   a width measurement circuit for measuring the width between successive transition points;
   an averaging circuit for averaging a predetermined number of the width measurements;
   a converting circuit for converting the average width measurements to width deviation values;
   an interpolating circuit for interpolating between successive ones of the width deviation values;
   a frequency conversion circuit for converting the interpolated width deviation values from the interpolating circuit to frequency deviation values;
   an equalizing circuit for equalizing the frequency deviation values from the frequency conversion circuit to form soft estimates of underlying source bits; and
   a decision circuit for forming hard estimates of the underlying source bits from the soft estimates.

2. The detector of claim 1 wherein the predetermined number of width measurements averaged by the averaging circuit is a programmable parameter.

3. The detector of claim 1 wherein the interpolating circuit is a frequency locked loop (FLL) configured to interpolate between successive width deviation values rather than frequency deviation values.

4. The detector of claim 3 wherein the transition point detector detects transition points at a frequency $f_m$, width deviation values are provided to the FLL at the frequency $f_m$, a desired symbol frequency is $f_T$, and the frequency conversion and equalizing circuits are clocked at a second sampling frequency $f_{s2}$ selected to be an integral multiple of $f_T$.

5. The detector of claim 1 further comprising a second averaging circuit for averaging a predetermined number of frequency deviation values.

6. The detector of claim 1 wherein the detector is implemented on an integrated circuit chip.

7. A digital detector comprising:
   a transition point detector for detecting transition points in an input signal, successive transition points being separated by a width;
   a width measurement circuit for measuring the width between successive transition points;
   an averaging circuit for averaging a predetermined number of the width measurements;
   an interpolating circuit for interpolating between successive values derived from the average width measurements;
   a frequency conversion circuit for converting the output of the interpolating circuit to frequency values; and
   an equalizing circuit for equalizing the frequency values from the frequency conversion circuit.

8. The detector of claim 7 wherein the transition point detector comprises a sampler for oversampling the input signal at a sampling frequency $f_{s1}$, a limiter for limiting the input signal to one of two bits, and digital logic for detecting transition points at locations where successive bits change value, the transition points being detected at a frequency $f_m$.

9. The detector of claim 8 wherein the width measurement circuit comprises a counter which is clocked at the sampling frequency $f_{s1}$ and a latch, where the counter is reset and the contents thereof latched at the frequency $f_m$.

10. The detector of claim 7 further comprising a conversion circuit for converting average width measurements from the averaging circuit into width deviation values which are input to the interpolating circuit.

11. The detector of claim 7 further comprising a conversion circuit for converting the output of the interpolating circuit to width deviation values.

12. The detector of claim 11 further comprising a second averaging circuit for averaging a predetermined number of the frequency deviation values and inputting the average values to the equalizing circuit.

13. The detector of claim 7 wherein the interpolating circuit is a frequency locked loop (FLL) configured to operate on values derived from width measurements.

14. The detector of claim 10 wherein the interpolating circuit is a frequency locked loop (FLL) configured to operate on the width deviation values from the conversion circuit.

15. The detector of claim 14 wherein the transition point detector is clocked at a first sampling frequency $f_{s1}$, and detects transition points at a frequency $f_m$, width deviation values are provided to the FLL at the frequency $f_m$, a desired symbol rate is $f_T$, and the equalizing circuit and frequency conversion circuit are clocked at a second sampling frequency $f_{s2}$ selected to be an integral multiple of $f_T$, and to resample the output of the interpolating circuit so that substantial synchronization is achieved between $f_m$ and $f_T$.

16. The detector of claim 7 further comprising a decision circuit for deriving hard estimates of underlying source bits from equalized values generated by the equalizing circuit.

17. A digital detector comprising;
transition point detection means for detecting transition points in an input signal, successive transition points being separated by a width;
width measurement means for measuring the width between successive transition points;
averaging means for averaging a predetermined number of the width measurements;
interpolating means for interpolating between successive values derived from the average width measurements;
frequency conversion means for converting the output of the interpolating means to frequency values; and
equalizing means for equalizing the frequency values from the frequency conversion means.

18. The detector of claim 17 further comprising conversion means for converting the average width measurements from the averaging means into width deviation values which are input to the interpolating means.

19. The detector of claim 17 further comprising conversion means for converting the output from the interpolating means into width deviation values.

20. The detector of claim 17 further comprising second averaging means for averaging a predetermined number of the frequency values.

21. The detector of claim 17 further comprising decision means for deriving hard estimates of underlying source bits from the output of the equalizing means.

22. A digital detector configured to successively measure a pulse width of an incoming signal having a carrier frequency to generate width measurements, comprising:
a first filter for averaging a predetermined number of the width measurements;
an interpolating circuit for interpolating between successive width values derived from the average width measurements;
a second filter for averaging frequency deviation values derived from the output of the interpolating circuit; and
an equalizing circuit for mitigating any intersymbol interference introduced by the first or second filters or the interpolating circuit.

23. A method for detecting an input signal, comprising:
detecting transition points in the input signal, successive transition points being separated by a width;
measuring the width between successive transition points;
averaging a predetermined number of the width measurements;
converting the average width measurements to width deviation values;
interpolating between successive ones of the width deviation values;
converting the interpolated width deviation values to frequency deviation values;
equalizing the frequency deviation values to form soft estimates of underlying source bits; and
forming hard estimates of the underlying source bits from the soft estimates.

24. The method of claim 23 wherein the detecting step comprises detecting zero crossings of the input signal.

25. The method of claim 23 wherein the predetermined number of width measurements is programmable.

26. The method of claim 23 wherein said detecting step comprises oversampling the input signal, limiting the input signal to one of two bits, and detecting transition points at locations where the values of successive bits change.

27. The method of claim 23 wherein the step of converting the average width measurements comprises subtracting the constant $$c_0 = \frac{M \times f_{s1}}{2 \times f_c}$$

from the average width measurements, where M is a programmable number of width measurements which are averaged in the averaging step, $f_{s1}$ is the sampling frequency, and $f_c$ is the carrier frequency of the input signal.

28. A method of detecting an input signal, comprising:
detecting transition points in the input signal, successive transition points being separated by a width;
measuring the width between successive transition points;
averaging a predetermined number of the width measurements;
interpolating between successive values derived from the average width measurements;
converting the interpolated values into frequency values; and
equalizing values derived from the frequency values.

29. The method of claim 28 further comprising forming width deviation values from the average width measurements, and performing the interpolating step on the width deviation values.

30. The method of claim 28 further comprising averaging a predetermined number of the frequency values, and performing the equalizing step on the averaged values.

31. The method of claim 28 further comprising deriving hard estimates of source bits from equalized values generated by the equalizing step.

32. A method of detecting an input signal comprising:
- a step for detecting transition points in the input signal, successive transition points being separated by a width;
- a step for measuring the width between successive transition points;
- a step for averaging a predetermined number of the width measurements;
- a step for interpolating between successive values derived from the average width measurements;
- a step for converting the interpolated values to frequency values; and
- a step for equalizing values derived from the frequency values.

33. The method of claim 32 further comprising a step for converting the average width measurements into width deviation values.

34. The method of claim 32 further comprising a step for converting the interpolated values into frequency deviation values.

35. The method of claim 34 further comprising a step for averaging a predetermined number of the frequency deviation values.

36. The method of claim 32 further comprising a step for producing hard estimates of underlying source bits from equalized values generated by the equalizing step.

* * * * *